United States Patent
Nakano et al.

(10) Patent No.: US 7,770,145 B2
(45) Date of Patent: Aug. 3, 2010

(54) SEMICONDUCTOR DEVICE PATTERN CREATION METHOD, PATTERN DATA PROCESSING PROGRAM, AND SEMICONDUCTOR DEVICE MANUFACTURING METHOD

(75) Inventors: Ayako Nakano, Yokohama (JP); Satoshi Tanaka, Kawasaki (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1073 days.

(21) Appl. No.: 11/474,297

(22) Filed: Jun. 26, 2006

(65) Prior Publication Data

US 2007/0003127 A1 Jan. 4, 2007

(30) Foreign Application Priority Data

Jun. 27, 2005 (JP) ............................. 2005-186311

(51) Int. Cl.
*G06F 17/50* (2006.01)
(52) U.S. Cl. ............................................ 716/21; 716/1
(58) Field of Classification Search ................ 716/1, 716/21; 382/144
See application file for complete search history.

(56) References Cited

U.S. PATENT DOCUMENTS

| 6,853,743 | B2 | | 2/2005 | Kotani et al. | |
| 7,266,801 | B2 | * | 9/2007 | Kotani et al. | 716/21 |
| 2002/0038899 | A1 | * | 4/2002 | Yamaguchi | 257/401 |
| 2005/0229148 | A1 | * | 10/2005 | Melvin | 716/21 |

FOREIGN PATENT DOCUMENTS

JP 6-291186 10/1994

* cited by examiner

*Primary Examiner*—Jack Chiang
*Assistant Examiner*—Magid Y Dimyan
(74) *Attorney, Agent, or Firm*—Finnegan, Henderson, Farabow, Garrett & Dunner, L.L.P.

(57) ABSTRACT

A correction target pattern having a size not more than a threshold value is extracted from first design data containing a pattern of a semiconductor integrated circuit. The first characteristic of the semiconductor integrated circuit is calculated on the basis of the first design data. Second design data is generated by correcting the correction target pattern contained in the first design data. The second characteristic of the semiconductor integrated circuit is calculated on the basis of the second design data. It is checked whether the characteristic difference between the first characteristic and the second characteristic falls within a tolerance. It is decided to use the second design data to manufacture the semiconductor integrated circuit when the characteristic difference falls within the tolerance.

11 Claims, 13 Drawing Sheets

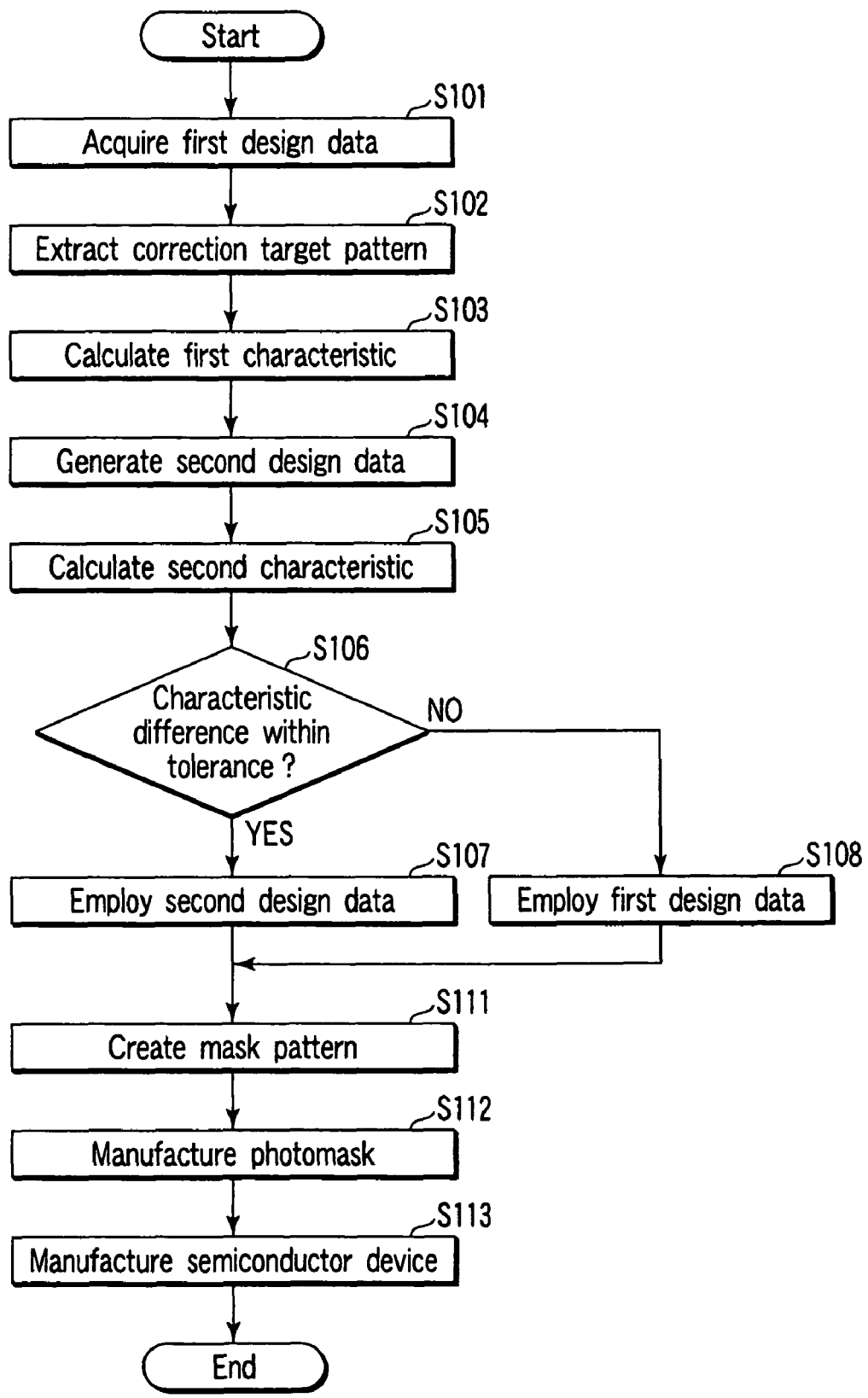
F I G. 2

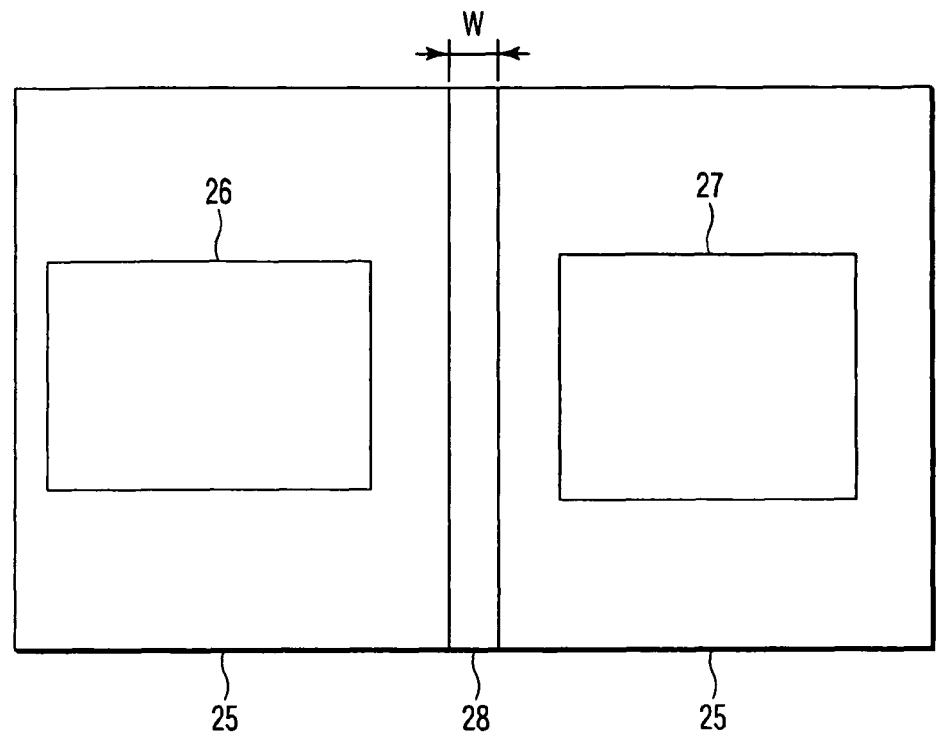
F I G. 5
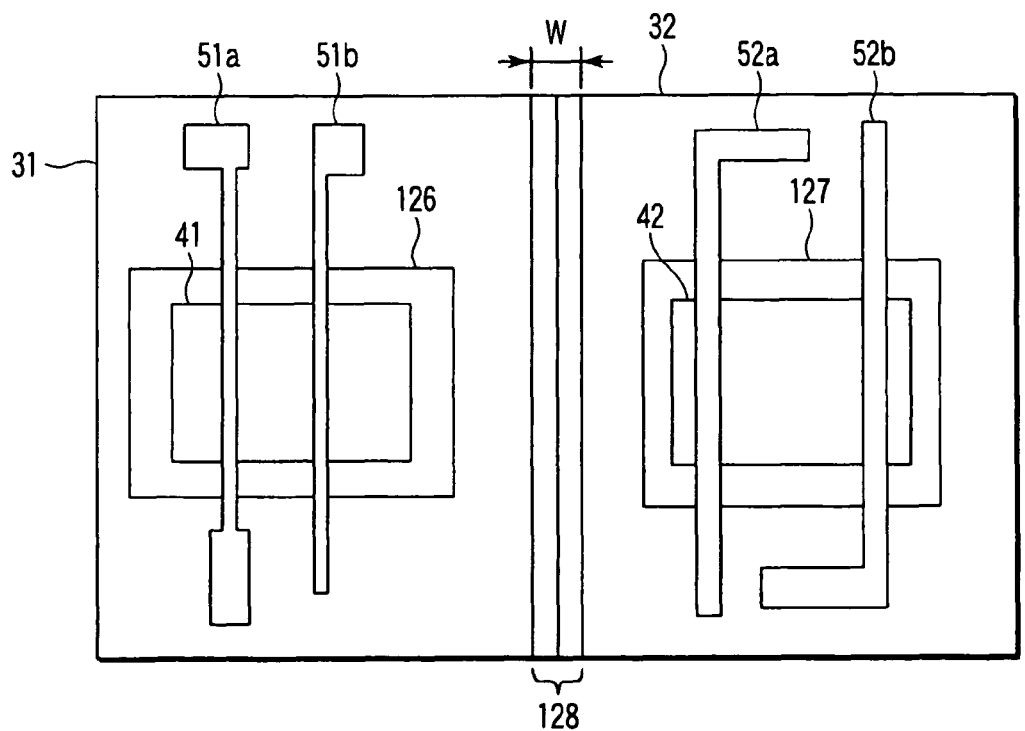
F I G. 6

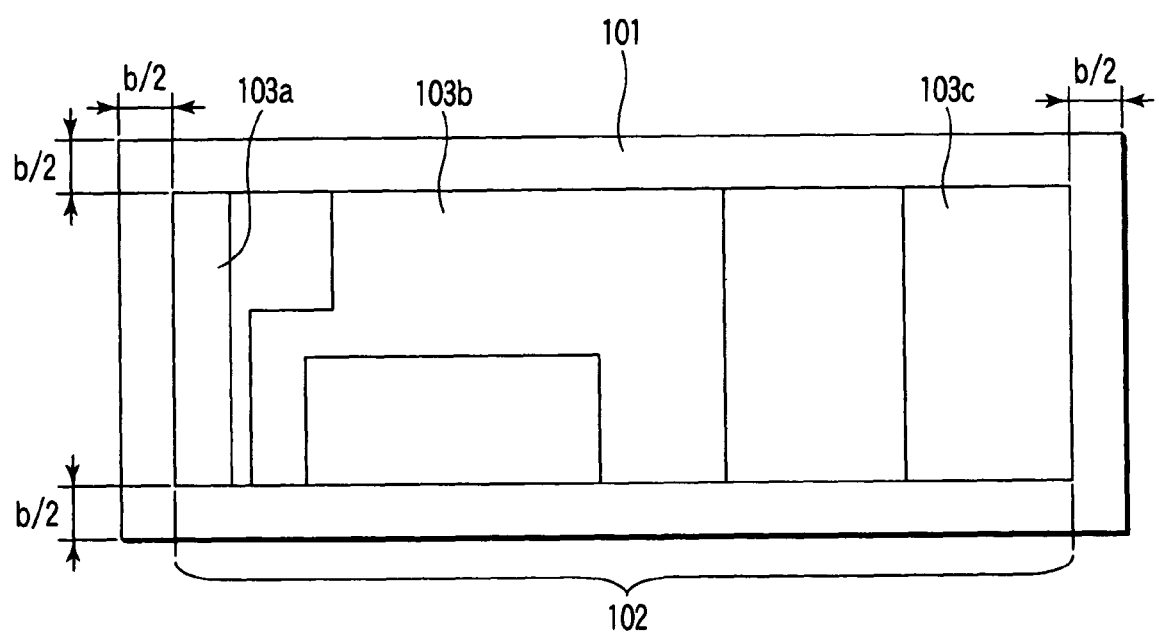
F I G. 10

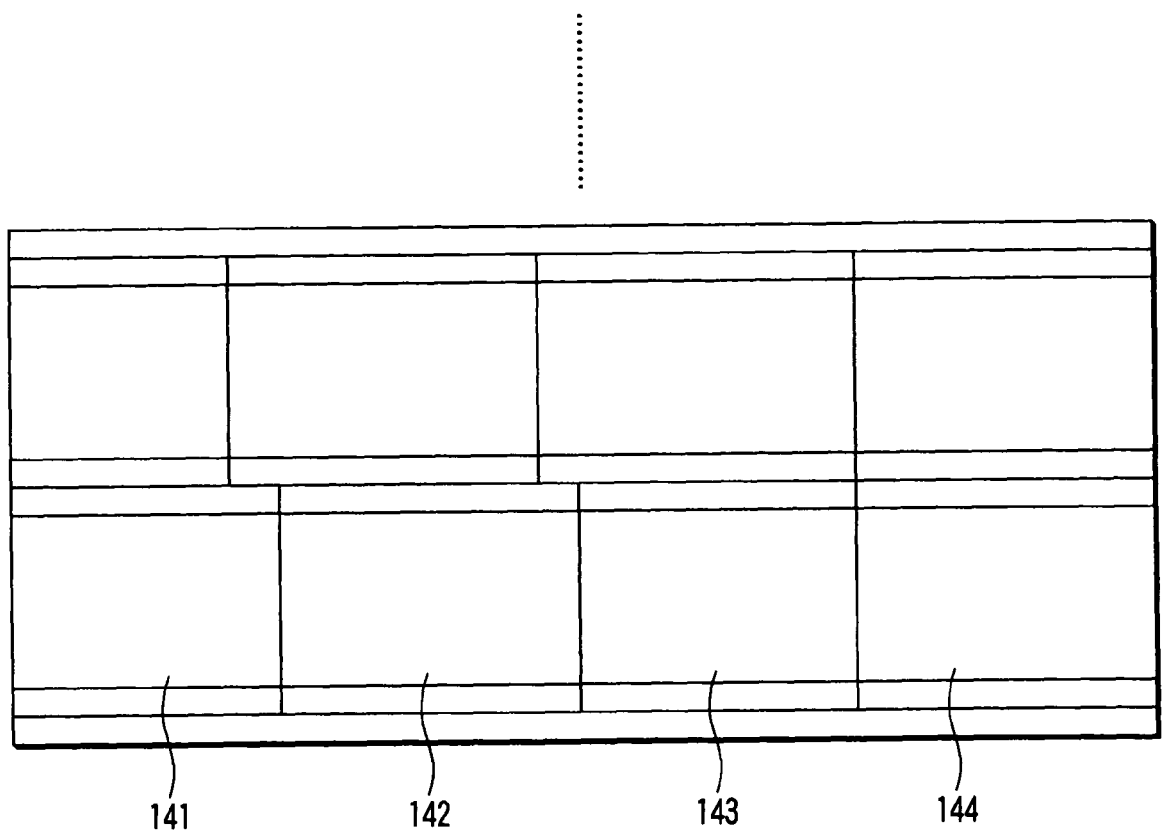
F I G. 16

SEMICONDUCTOR DEVICE PATTERN CREATION METHOD, PATTERN DATA PROCESSING PROGRAM, AND SEMICONDUCTOR DEVICE MANUFACTURING METHOD

CROSS-REFERENCE TO RELATED APPLICATIONS

This application is based upon and claims the benefit of priority from prior Japanese Patent Application No. 2005-186311, filed Jun. 27, 2005, the entire contents of which are incorporated herein by reference.

BACKGROUND OF THE INVENTION

1. Field of the Invention

The present invention relates to design and manufacturing method of a semiconductor device (a semiconductor integrated circuit) and, more particularly, to a semiconductor device pattern creation method, pattern data processing method, pattern data processing program, and semiconductor device manufacturing method.

2. Description of the Related Art

Along with the recent increase in the degree of integration and the operation speed of semiconductor integrated circuits, requirements of microfabrication in device pattern formation are becoming very rigorous. However, shortening the irradiation light wavelength in exposure apparatuses or the increase in numerical aperture (NA) of optical systems cannot sufficiently meet the requirements of microfabrication, and the margin necessary in the lithography process is hard to ensure. For this reason, it is important to increase the accuracy of a resolution enhancement technique (RET) and optical proximity correction (OPC). However, the margin can hardly be ensured even using RET and OPC. The difficulty of the lithography process to achieve microfabrication increases, posing a serious problem of increase in lithography cost.

The requirements of microfabrication are especially conspicuous in a device calls a system LSI. In designing a system LSI, a cell library is often used in which a plurality of modules called cells with individual functions are gathered. In chip design, cell patterns included in the cell library are placed on the basis of circuit information determined by circuit design, and a predetermined function is implemented by routing between or in the placed cells (e.g., Jpn. Pat. Appln. KOKAI Publication No. 6-291186). To shrink the chip area, individual cell patterns must be shrunk. To shrink the cell patterns, the device pattern must be microfabricated. Hence, the difficulty of the lithography process inevitably increases.

BRIEF SUMMARY OF THE INVENTION

According to a first aspect of the present invention, there is provided a semiconductor device pattern creation method comprising: extracting a correction target pattern having a size not more than a threshold value from first design data containing a pattern of a semiconductor device; calculating a first characteristic of the semiconductor device on the basis of the first design data; generating second design data by correcting the correction target pattern contained in the first design data; calculating a second characteristic of the semiconductor device on the basis of the second design data; checking whether a characteristic difference between the first characteristic and the second characteristic falls within a tolerance; and deciding to use the second design data to manufacture the semiconductor device when the characteristic difference falls within the tolerance.

According to a second aspect of the present invention, there is provided a semiconductor device pattern data processing method comprising: acquiring a size of an overlapping area of each of a plurality of cells included in a cell library to be used to design a semiconductor device, the overlapping area being a region which is arranged inside the cell and in which placement of a functional pattern to impart a function to the cell is inhibited; creating first design data by placing the plurality of cells; calculating a first characteristic of the semiconductor device on the basis of the first design data; extracting a correction target region in which, of patterns formed by combining the overlapping areas upon placing the plurality of cells, a pattern has a size not more than a threshold value; generating second design data by correcting the correction target region contained in the first design data; calculating a second characteristic of the semiconductor device on the basis of the second design data; checking whether a characteristic difference between the first characteristic and the second characteristic falls within a tolerance; and deciding to use the second design data to manufacture the semiconductor device when the characteristic difference falls within the tolerance.

According to a third aspect of the present invention, there is provided a semiconductor device manufacturing method of forming a pattern of a semiconductor device by using a photomask, comprising: formation of the photomask including extracting a correction target pattern having a size not more than a threshold value from first design data containing a pattern of a semiconductor device, calculating a first characteristic of the semiconductor device on the basis of the first design data, generating second design data by correcting the correction target pattern contained in the first design data, calculating a second characteristic of the semiconductor device on the basis of the second design data, checking whether a characteristic difference between the first characteristic and the second characteristic falls within a tolerance, and deciding to use the second design data to manufacture the semiconductor device when the characteristic difference falls within the tolerance.

According to a fourth aspect of the present invention, there is provided a pattern data processing program for designing a pattern of a semiconductor device, comprising: extracting a correction target pattern having a size not more than a threshold value from first design data containing a pattern of a semiconductor device; calculating a first characteristic of the semiconductor device on the basis of the first design data; generating second design data by correcting the correction target pattern contained in the first design data; calculating a second characteristic of the semiconductor device on the basis of the second design data; checking whether a characteristic difference between the first characteristic and the second characteristic falls within a tolerance; and deciding to use the second design data to manufacture the semiconductor device when the characteristic difference falls within the tolerance.

BRIEF DESCRIPTION OF THE SEVERAL VIEWS OF THE DRAWING

FIG. 2 is a flowchart showing a pattern creation method according to the first embodiment of the present invention;

FIG. 5 is a second schematic view showing cells so as to explain the pattern creation method according to the first embodiment of the present invention;

FIG. 6 is a third schematic view showing cells so as to explain the pattern creation method according to the first embodiment of the present invention;

FIG. 10 is a first schematic view showing cells so as to explain a pattern data processing method according to a third embodiment of the present invention;

FIG. 16 is a schematic view showing a cell pattern so as to explain a pattern data processing method according to a fifth embodiment of the present invention.

DETAILED DESCRIPTION OF THE INVENTION

Figure 1:
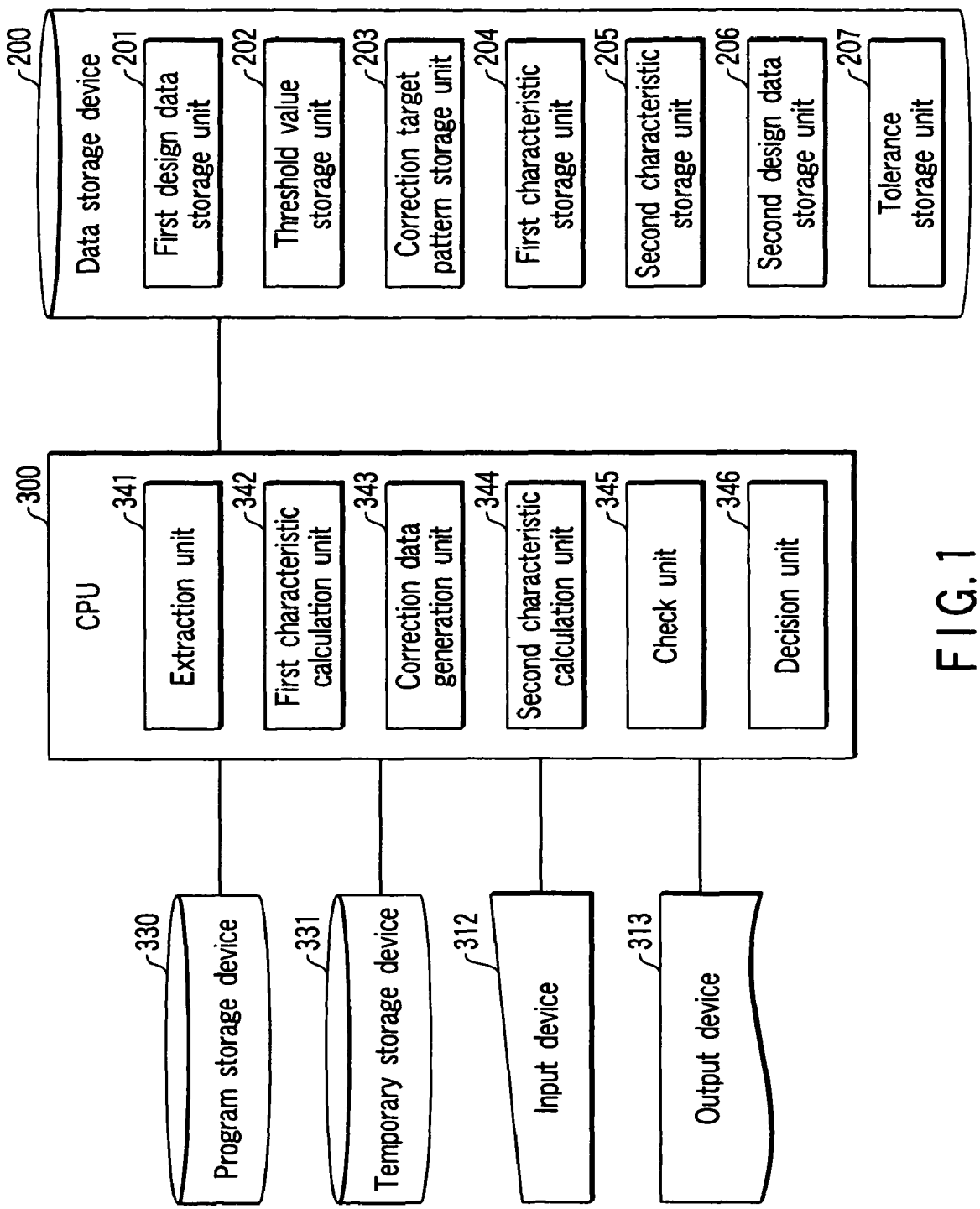
FIG. 1 is a schematic view showing a pattern creation system according to a first embodiment of the present invention.

The embodiments of the present invention will be described below with reference to the accompanying drawing. The same or similar reference numerals denote the same or similar parts throughout the drawing. The drawing shows only schematic views in which the relationship between the thickness and the planar sizes and the ratio of thicknesses of layers are different from the actuality. Detailed thicknesses and sizes should be determined by checking the following explanation. The views of the drawing also include parts with different size relationships and ratios.

First Embodiment

A pattern creation system according to the first embodiment has a central processing unit (CPU) 300, as shown in FIG. 1. The CPU 300 comprises an extraction unit 341, first characteristic calculation unit 342, correction data generation unit 343, second characteristic calculation unit 344, check unit 345, and decision unit 346. The extraction unit 341 extracts a correction target pattern having a size equal to or smaller than a threshold value from the first design data of a semiconductor integrated circuit. The first characteristic calculation unit 342 calculates the first characteristic of the semiconductor integrated circuit to be manufactured on the basis of the first design data. The correction data generation unit 343 generates second design data by correcting the correction target pattern contained in the first design data. The second characteristic calculation unit 344 calculates the second characteristic of the semiconductor integrated circuit to be manufactured on the basis of the second design data. The check unit 345 checks whether the characteristic difference between the first characteristic and the second characteristic falls within the tolerance. The decision unit 346 decides to use the second design data to manufacture the semiconductor integrated circuit if the characteristic difference (difference) falls within the tolerance.

A data storage device 200 is connected to the CPU 300. The data storage device 200 comprises a first design data storage unit 201, threshold value storage unit 202, correction target pattern storage unit 203, first characteristic storage unit 204, second characteristic storage unit 205, second design data storage unit 206, and tolerance storage unit 207. The first design data storage unit 201 stores the first design data. The threshold value storage unit 202 stores the threshold value referred to by the extraction unit 341. The correction target pattern storage unit 203 stores the correction target pattern extracted by the extraction unit 341. The first characteristic storage unit 204 stores the first characteristic calculated by the first characteristic calculation unit 342. The second characteristic storage unit 205 stores the second characteristic calculated by the second characteristic calculation unit 344. The second design data storage unit 206 stores the second design data generated by the correction data generation unit 343. The tolerance storage unit 207 stores the tolerance referred to by the check unit 345.

An input device 312, output device 313, program storage device 330, and temporary storage device 331 are also connected to the CPU 300. As the input device 312, for example, a keyboard and a pointing device such as a mouse can be used. As the output device 313, an image display device such as a liquid crystal display or monitor and a printer can be used. The program storage device 330 stores, e.g., an operating system to control the CPU 300. The temporary storage device 331 successively stores calculation results by the CPU 300. As the program storage device 330 and temporary storage device 331, a recording medium such as a semiconductor memory, magnetic disk, optical disk, magnetooptical disk, or magnetic tape to record a program can be used.

A semiconductor integrated circuit manufacturing method using the pattern creation method according to the first embodiment will be described next with reference to the flowchart shown in FIG. 2.

(a) In step S101, the extraction unit 341 shown in FIG. 1 reads out the first design data of the semiconductor integrated circuit from the first design data storage unit 201. Next, the extraction unit 341 reads out a threshold value T from the threshold value storage unit 202. The threshold value T is, e.g., the minimum size of an implantation target region in the ion implantation process. However, the threshold value T is not limited to this and may be a value obtained by adding a margin to the minimum size. Alternatively, the threshold value T may be a value that satisfies $0.5 \geqq T/(\lambda/NA)$ where $\lambda$ is the wavelength of light in exposure, and NA is the numerical aperture of the projecting optical system of an exposure apparatus used in exposure.

(b) In step S102, the extraction unit 341 extracts a correction target pattern having a size $W_T$ equal to or smaller than the threshold value T from a plurality of patterns contained in the first design data. The extracted correction target pattern is stored in the correction target pattern storage unit 203. In step S103, the first characteristic calculation unit 342 calculates the first characteristic of the semiconductor integrated circuit to be manufactured on the basis of the first design data. The "first characteristic" includes at least one of the transistor characteristic, circuit characteristic, electrical characteristic, timing characteristic, wiring capacitance characteristic, and wiring resistance characteristic. For example, to calculate the transistor characteristic, the first characteristic calculation unit 342 predicts the structure of a transistor to be manufactured on the basis of the first design data by process analysis using an implantation model of a Monte Carlo method or a diffusion model of a kinetic Monte Carlo method. The first characteristic calculation unit 342 also obtains the channel length of the transistor from the predicted structure and calculates a threshold voltage and the like on the basis of the channel length. The first characteristic calculation unit 342 stores the calculated first characteristic in the first characteristic storage unit 204.

(c) In step S104, the correction data generation unit 343 reads out the first design data of the semiconductor integrated circuit from the first design data storage unit 201. Next, the correction data generation unit 343 corrects the correction target pattern extracted by the extraction unit 341. "Correction" indicates erasing the correction target pattern itself. After erasing the correction target pattern, the correction data generation unit 343 generates second design data by removing the correction target pattern from the first design data. The correction data generation unit 343 stores the generated second design data in the second design data storage unit 206.

(d) In step S105, the second characteristic calculation unit 344 reads out the second design data from the second design data storage unit 206. The second characteristic calculation unit 344 calculates the second characteristic of the semiconductor integrated circuit to be manufactured on the basis of the second design data. Like the first characteristic, the "second characteristic" includes at least one of the transistor characteristic, circuit characteristic, electrical characteristic, timing characteristic, wiring capacitance characteristic, and wiring resistance characteristic. The second characteristic calculation unit 344 stores the calculated second characteristic in the second characteristic storage unit 205.

(e) In step S106, the check unit 345 reads out the first characteristic from the first characteristic storage unit 204 and the second characteristic from the second characteristic storage unit 205. The check unit 345 also reads out a tolerance R from the tolerance storage unit 207. Next, the check unit 345 calculates the characteristic difference between the first characteristic and the second characteristic and checks whether the calculated characteristic difference falls within the tolerance R. For example, assume that each of the first characteristic and second characteristic is a timing characteristic. In this case, the check unit 345 checks, by comparing the characteristic difference with the tolerance R, whether a delay failure occurs in the manufactured semiconductor integrated circuit due to the characteristic difference between the first characteristic and the second characteristic. If the calculated characteristic difference falls within the tolerance R, the flow advances to step S107. If the calculated characteristic difference falls outside the tolerance R, the flow advances to step S108.

(f) If the calculated characteristic difference falls within the tolerance R, it means that the removed correction target pattern is a pattern with a low significance and has no influence on the characteristic of the semiconductor integrated circuit. It also means that the semiconductor integrated circuit manufactured on the basis of the second design data is equivalent to the semiconductor integrated circuit manufactured on the basis of the first design data. In this case, in step S107, the decision unit 346 decides to use the second design data to manufacture the semiconductor integrated circuit.

(g) If the calculated characteristic difference falls outside the tolerance R in step S106, it means that the removed correction target pattern is a significant pattern having influence on the characteristic of the semiconductor integrated circuit. It also means that the semiconductor integrated circuit manufactured on the basis of the second design data is not equivalent to the semiconductor integrated circuit manufactured on the basis of the first design data. In this case, in step S108, the decision unit 346 decides to use the first design data to manufacture the semiconductor integrated circuit.

(h) In step S111, the first design data or second design data decided to use is subjected to graphic data processing such as interlayer logic operation, black/white inversion, overlap removal, narrowing/widening, and enlargement/reduction to create a mask pattern. In step S112, a photomask having the mask pattern is manufactured by using, e.g., an EB lithography apparatus. Finally in step S113, a semiconductor integrated circuit is manufactured by using the photomask, thus ending the semiconductor integrated circuit manufacturing method according to this embodiment.

According to the semiconductor integrated circuit manufacturing method using the pattern creation method according to the first embodiment shown in FIG. 2, when the characteristic difference between the first characteristic and the second characteristic falls within the tolerance R, the second design data obtained by deleting the correction target pattern having a size $D_T$ equal to or smaller than the threshold value T is used to manufacture the semiconductor integrated circuit. When the correction target pattern having the size $D_T$ equal to or smaller than the threshold value T is contained in the design data, the difficulty of the lithography process increases, and the semiconductor integrated circuit manufacturing cost increases. However, when the semiconductor integrated circuit is manufactured on the basis of the second design data, condition setting, maintenance, and the like in the lithography process included in step S113 can be simplified because the correction target pattern having the size $D_T$ equal to or smaller than the threshold value T is deleted. In pattern creation method according to the first embodiment, it is verified in step S106 that even the semiconductor integrated circuit manufactured on the basis of the second design data is equivalent to the semiconductor integrated circuit manufactured on the basis of the first design data. Hence, the semiconductor integrated circuit manufacturing cost can be reduced without degrading the quality by using the second design data. For example, when the pattern creation method of the first embodiment is applied to the development step of semiconductor integrated circuits of 65-nm node generation, the lithography cost in the ion implantation process can be reduced to about ⅓ as compared to the prior-art method.

The semiconductor integrated circuit manufacturing method using the pattern creation method of the first embodiment is not limited to the sequence shown in FIG. 2. For example, step S102 may be executed after step S103. In the above description, "correction" in step S103 indicates erasing the correction target pattern itself. Instead, "correction" may indicate correcting the size $W_T$ equal to or smaller than the threshold value T of the correction target pattern to a size $W_U$ larger than the threshold value T. In this case, in step S104, the correction data generation unit 343 generates second design data by correcting the size $W_T$ equal to or smaller than the threshold value T of the correction target pattern in the first design data to the size $W_U$ larger than the threshold value T. In addition, if the characteristic difference between the first characteristic and the second characteristic falls within the tolerance R in step S106, the decision unit 346 decides to use the second design data containing the corrected correction target pattern to manufacture the semiconductor integrated circuit in step S107.

Figure 3:
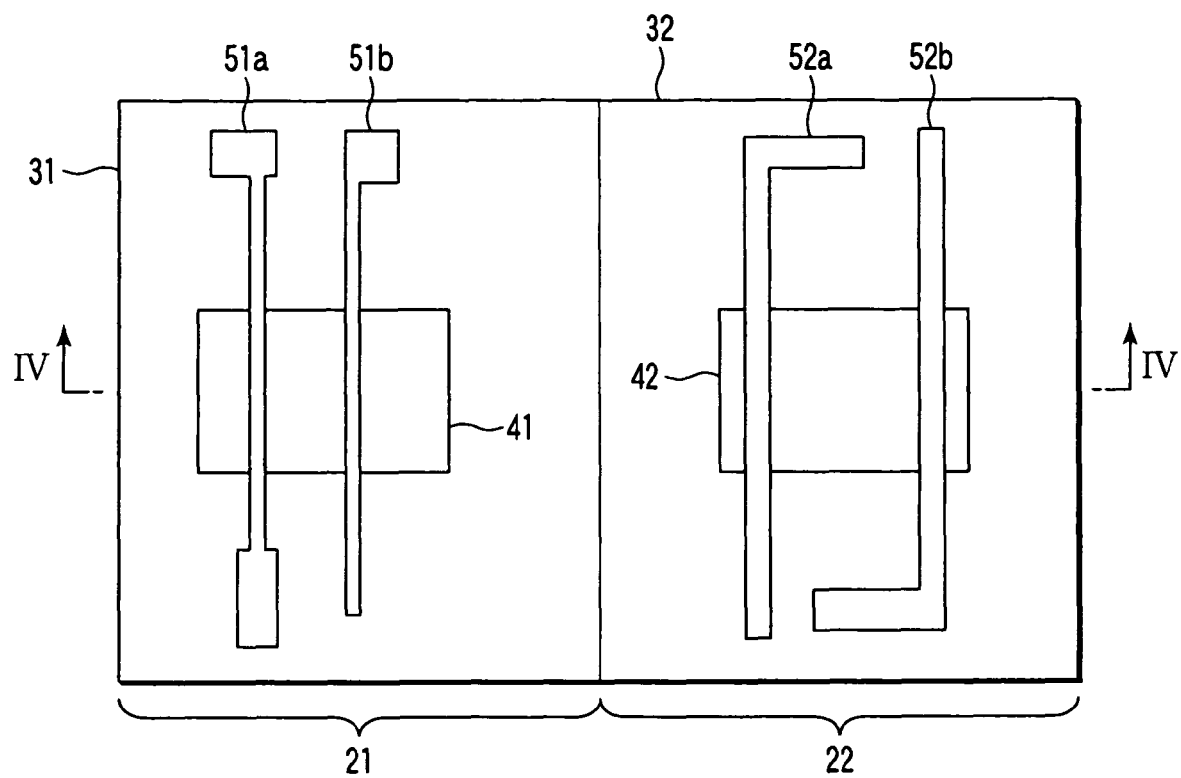
FIG. 3 is a first schematic view showing cells so as to explain the pattern creation method according to the first embodiment of the present invention.
Figure 4:
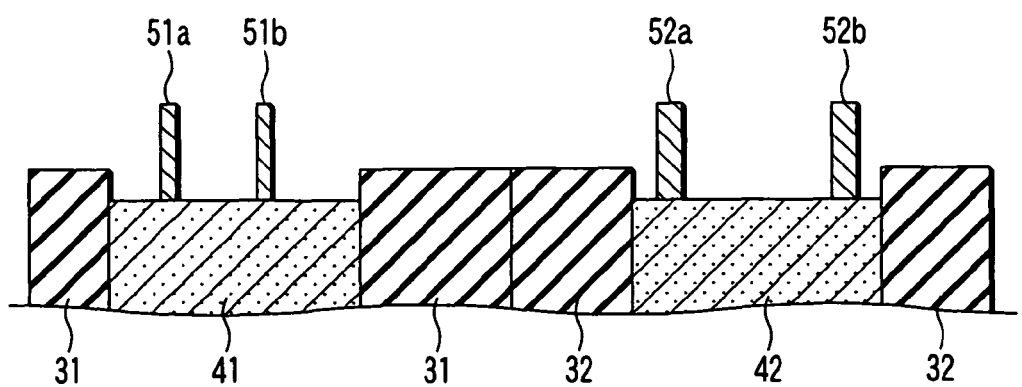
FIG. 4 is a sectional view taken along a line IV-IV in FIG. 3 so as to explain the pattern creation method according to the first embodiment of the present invention.

An application example of the pattern creation method of the first embodiment will be described next with reference to FIGS. 3 to 7. FIG. 3 and FIG. 4 showing a sectional view taken along a line IV-IV in FIG. 3 show a first cell 21 and a second cell 22 which are contained in the first design data and are adjacent to each other. The first cell 21 has an element region 41 surrounded by an element isolation region 31 and gates 51a and 51b arranged on the element region 41. The second cell 22 has an element region 42 surrounded by an element isolation region 32 and gates 52a and 52b arranged on the element region 42.

When an impurity such as phosphorus ($P^+$) is to be implanted in part of the first cell 21 and second cell 22, a resist mask 25 having opening patterns 26, 27, and 28 is placed on the first cell 21 and second cell 22, as shown in FIG. 5. For this reason, as shown in FIG. 6, the impurity is implanted in an implantation target region 126 corresponding to the opening pattern 26, an implantation target region 127 corresponding to the opening pattern 27, and an implantation target region 128 corresponding to the opening pattern 28 on the basis of the design.

Figure 7:
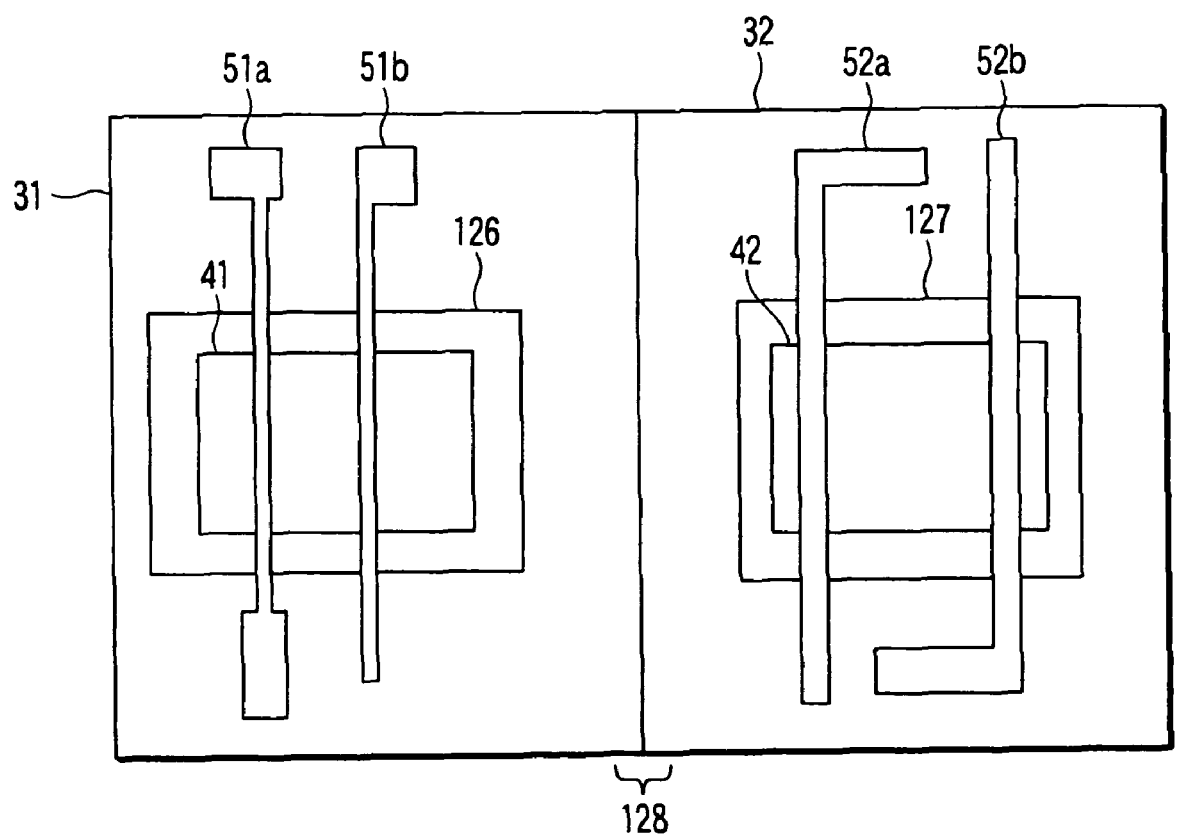
FIG. 7 is a fourth schematic view showing cells so as to explain the pattern creation method according to the first embodiment of the present invention.

In the pattern creation method according to the first embodiment, when a size W of the opening pattern 28 and corresponding implantation target region 128 is the size $W_T$ equal to or smaller than the minimum size threshold value T of the implantation target region in ion implantation, the second design data is generated by erasing the implantation target region 128 from the first design data, as shown in FIG. 7. However, if the characteristic does not change even when the semiconductor integrated circuit is manufactured on the basis of the second design data, providing the implantation target region 128 is of no significance in manufacturing the semiconductor integrated circuit. When the semiconductor integrated circuit is manufactured on the basis of the second design data, the opening pattern 28 having the size $W_T$ equal to or smaller than the minimum size threshold value T need not be provided in the lithography process. For this reason, the difficulty of the lithography process can be decreased. As a result, the semiconductor integrated circuit can be manufactured at a low cost.

Second Embodiment

Figure 8:
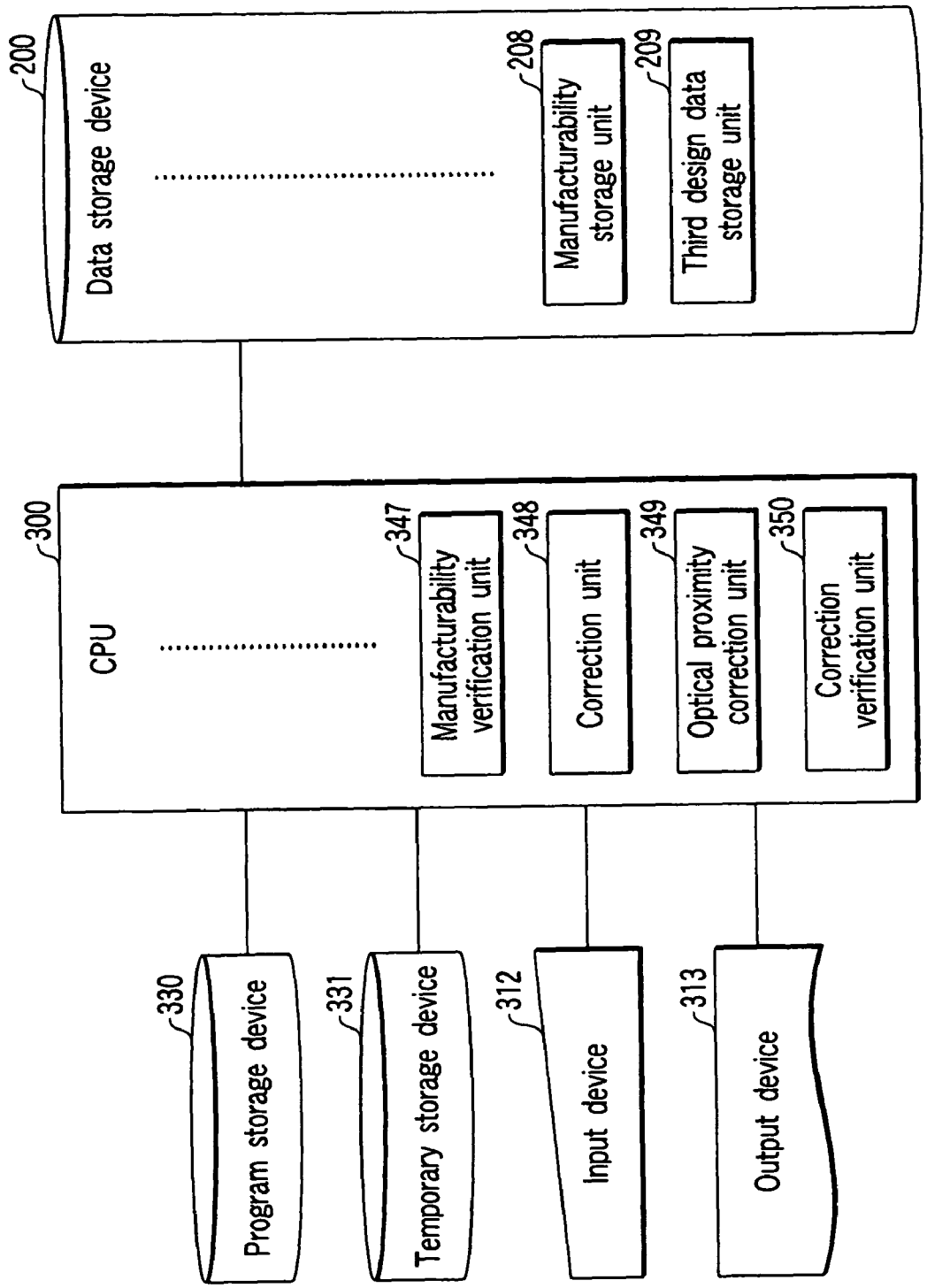
FIG. 8 is a schematic view showing a pattern creation system according to a second embodiment of the present invention.

A pattern creation system according to the second embodiment shown in FIG. 8 is different from FIG. 1 in that a CPU 300 further comprises a manufacturability verification unit 347, correction unit 348, optical proximity correction unit 349, and correction verification unit 350, and a data storage device 200 further comprises a manufacturability storage unit 208, and third design data storage unit 209.

The manufacturability verification unit 347 of the CPU 300 verifies manufacturability in the exposure process of a correction target pattern having a size $W_T$ equal to or smaller than a threshold value T. The correction unit 348 corrects the size $W_T$ equal to or smaller than the threshold value T of the correction target pattern to a size $W_U$ larger than the threshold value T by executing, e.g., a mask data processing (MDP) program. The correction unit 348 also generates third design data by correcting the correction target pattern of first design data. The optical proximity correction unit 349 executes optical proximity correction (OPC) processing of the third design data by executing, e.g., an OPC program. The correction verification unit 350 verifies whether a short circuit between patterns occurs in the third design data which has undergone OPC processing and whether patterns which should be connected are disconnected. The correction verification unit 350 also verifies whether a violation of design rule occurs in the third design data which has undergone OPC processing. The manufacturability storage unit 208 of the data storage device 200 stores the manufacturability verification result output from the manufacturability verification unit 347. The third design data storage unit 209 stores the third design data generated by the correction unit 348. The remaining constituent elements of the pattern creation system shown in FIG. 8 are the same as in the pattern creation system shown in FIG. 1, and a description thereof will be described.

A pattern creation method according to the second embodiment will be described next with reference to the flowchart shown in FIG. 9.

(a) Steps S101 to S105 are executed in the same way as in the processing in FIG. 2. In the second embodiment, if the calculated characteristic difference falls outside a tolerance R in step S106, the flow advances to step S201. In step S201, the manufacturability verification unit 347 verifies the manufacturability in exposure of a correction target pattern having the size $W_T$ equal to or smaller than the threshold value T. For example, the manufacturability verification unit 347 verifies the manufacturability of the correction target pattern by calculating the optical intensity of a projected image corresponding to the correction target pattern by exposure simulation using, e.g., a Fourier transform program. After verification, the manufacturability verification unit 347 stores the manufacturability verification result in the manufacturability storage unit 208.

(b) If it is determined by verification in step S201 that the manufacturability is more than a predetermined value because of, e.g., the placement position and the distance to an adjacent pattern even when the correction target pattern has the size $W_T$ equal to or smaller than the threshold value T, the flow advances to step S301. In step S301, a decision unit 346 decides to use the first design data to manufacture the semiconductor integrated circuit. If it is determined in step S201 that the manufacturability of the correction target pattern is not more than the predetermined value, the flow advances to step S202. In step S202, the correction unit 348 corrects the size $W_T$ equal to or smaller than the threshold value T of the correction target pattern to the size $W_U$ larger than the threshold value T by executing, e.g., an MDP program. The correction unit 348 decides the strength of correction on the basis of the manufacturability verification result stored in the manufacturability storage unit 208. After correction, the correction unit 348 stores, in the third design data storage unit 209, the third design data obtained by correcting the correction target pattern of the first design data.

(c) In step S203, the optical proximity correction unit 349 reads out the third design data from the third design data storage unit 209. The optical proximity correction unit 349 executes OPC processing of the third design data by executing, e.g., an OPC program. Then, the optical proximity correction unit 349 stores, in the third design data storage unit 209, the third design data which has undergone OPC processing. In step S204, the correction verification unit 350 reads out the third design data which has undergone OPC processing from the third design data storage unit 209. The correction verification unit 350 verifies whether a short circuit between patterns occurs in the third design data which has undergone OPC processing and whether patterns which should be connected are disconnected. The correction verification unit 350 also verifies whether a violation of design rule occurs in the third design data which has undergone OPC processing. If the correction verification unit 350 determines that the third design data has undergone OPC processing appropriately, the decision unit 346 decides in step S205 to use the third design data to manufacture the semiconductor integrated circuit, thus ending the pattern creation method according to the second embodiment.

The third design data generated by the above-described pattern creation method according to the second embodiment is corrected to increase the manufacturability. For this reason, even when the semiconductor integrated circuit is manufactured on the basis of the third design data, the difficulty in the lithography process can be decreased. As a result, the semiconductor integrated circuit can be manufactured at a low cost by using the third design data. It is verified in step S201 that the first design data decided to use also have high manufacturability. In this case, the semiconductor integrated circuit can be manufactured at a low cost even by using the first design data.

Third Embodiment

An "overlapping area" provided in each cell in designing a semiconductor integrated circuit on the basis of a cell library will be described. In the design process of a system LSI or ASIC device, a development method of placing a plurality of standard cells and then routing them to each other is widely employed. In this case, when a standard cell is placed, a pattern included in another standard cell to be placed adjacent to the placed cell cannot be specified. For this reason, to prevent any violation of design rule regardless of the pattern of the standard cell to be placed adjacent, an "overlapping area 101" shown in FIG. 10 is arranged inside each of the standard cells. Placement of a functional pattern to impart a function to the standard cell is inhibited in the overlapping area 101. Functional patterns 103a, 103b, and 103c are placed in a pattern placement region 102 surrounded by the overlapping area 101.

Figure 11:
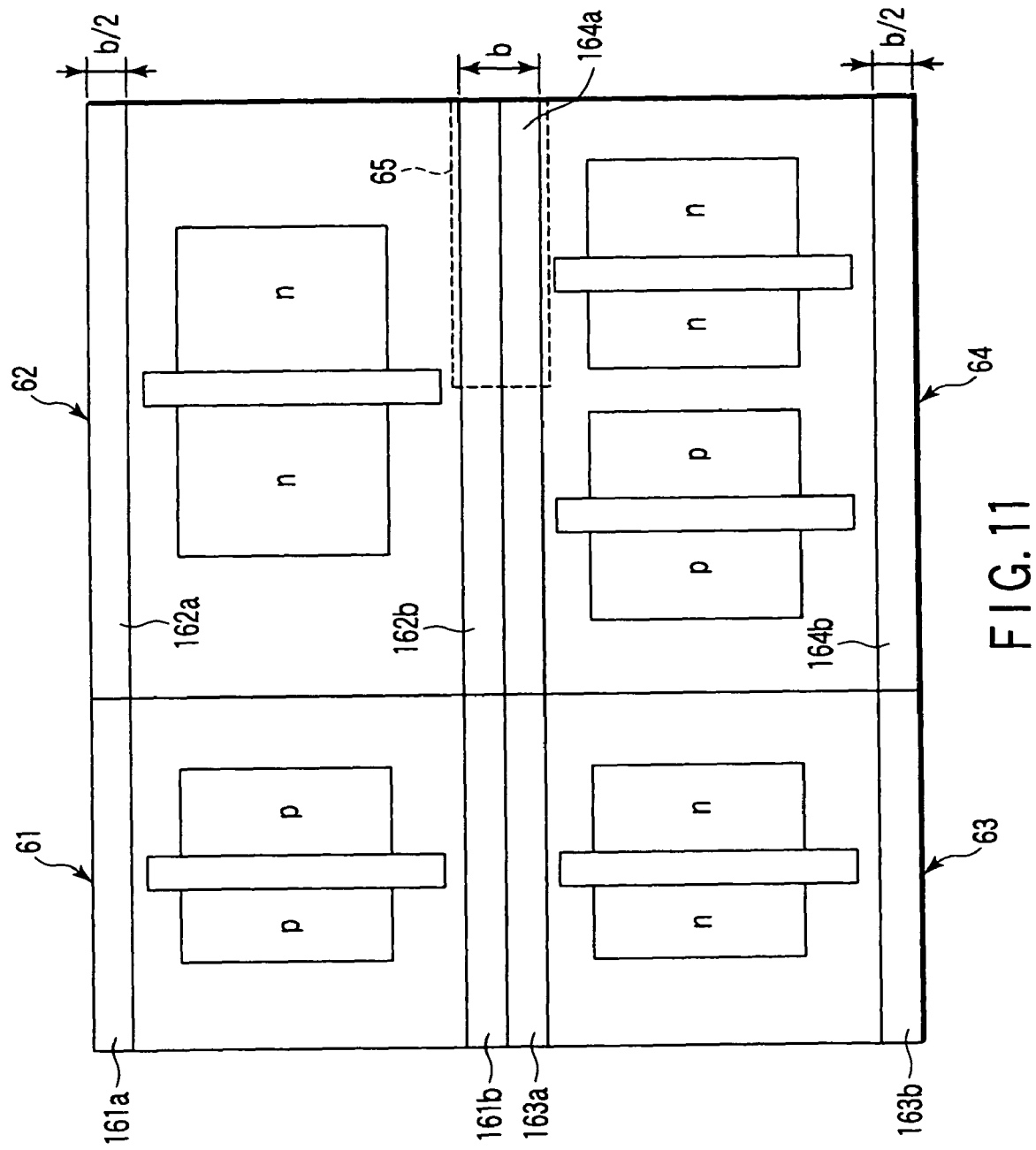
FIG. 11 is a second schematic view showing cells so as to explain the pattern data processing method according to the third embodiment of the present invention.

The minimum size (width) of the overlapping area must be ½ a minimum width b allowed for each layer in chip design, i.e., b/2. The example shown in FIG. 11 illustrates a cell pattern in which cells 61, 62, 63, and 64 are placed. In the cell 61, overlapping areas 161a and 161b are ensured. In the cell 62, overlapping areas 162a and 162b are ensured. In the cell 63, overlapping areas 163a and 163b are ensured. In the cell 64, overlapping areas 164a and 164b are ensured. Each of the overlapping areas 161a, 161b, 162a, 162b, 163a, 163b, 164a, and 164b has the width b/2. Hence, functional patterns included in the cells 61, 62, 63, and 64 are always spaced apart by the minimum width b allowable by the design rule. However, some functional patterns need not always be spaced apart by the minimum width b. For example, the minimum width b is unnecessary in a partial region 65 of the overlapping areas 162a and 164a, the overlapping areas 162a and 164a need not be ensured. In this case, ensuring an overlapping area in the partial region 65 is redundant for design and impedes chip area reduction.

Figure 12:
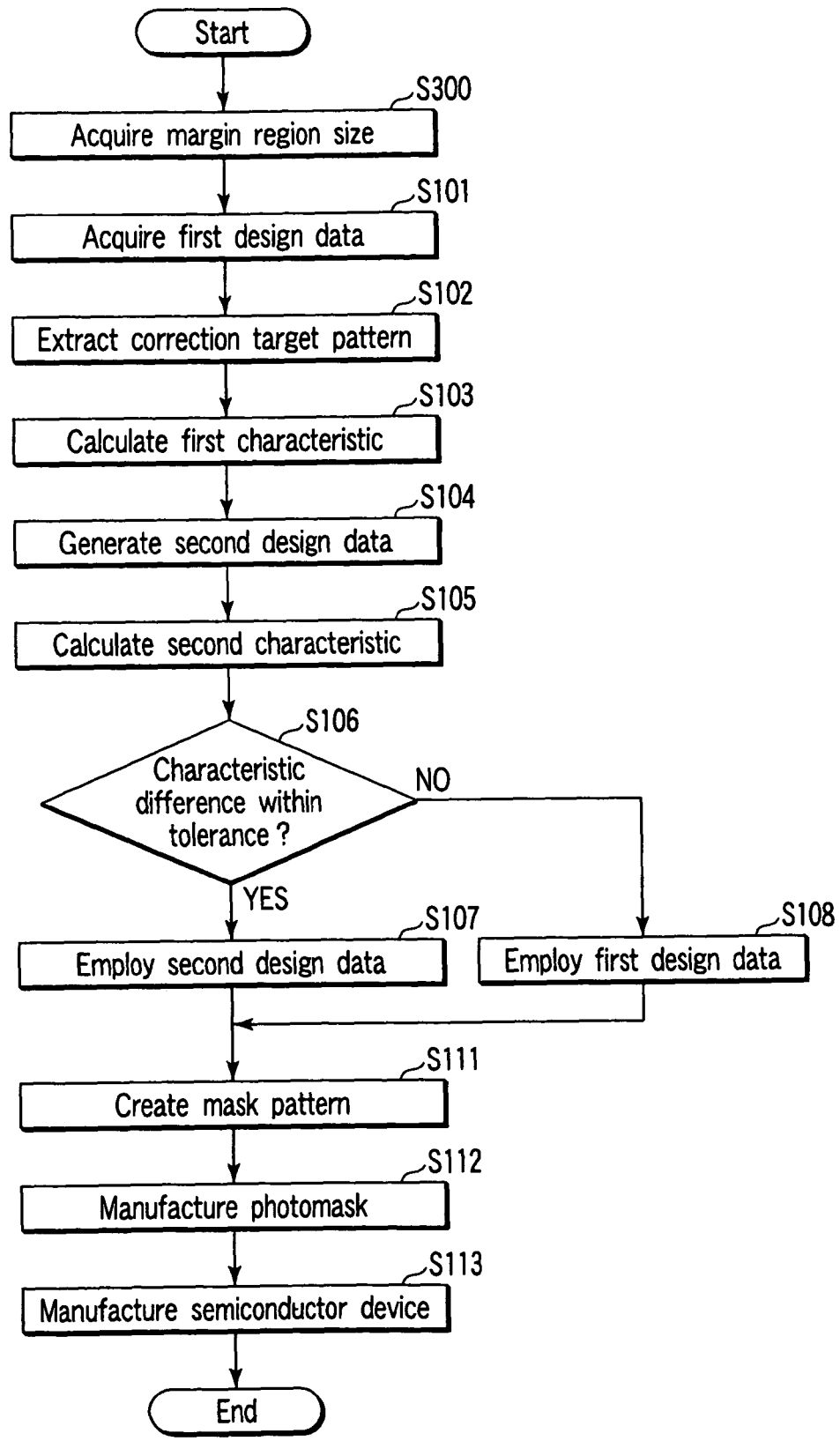
FIG. 12 is a flowchart showing the pattern data processing method according to the third embodiment of the present invention.

FIG. 12 is a flowchart showing a pattern data processing method according to the third embodiment.

First, in step S300, the size of each of the overlapping areas of a plurality of cells included in the cell library is acquired. Next, in step S101, the cell place & router tool in the CPU places and routes the cells included in the cell library to form first design data. The first design data is stored in a first design data storage unit 201. Subsequently, an extraction unit 341 reads out the first design data of the semiconductor integrated circuit from the first design data storage unit 201. Steps S102 to S113 are executed in the same way as in the processing in FIG. 2.

Figure 9:
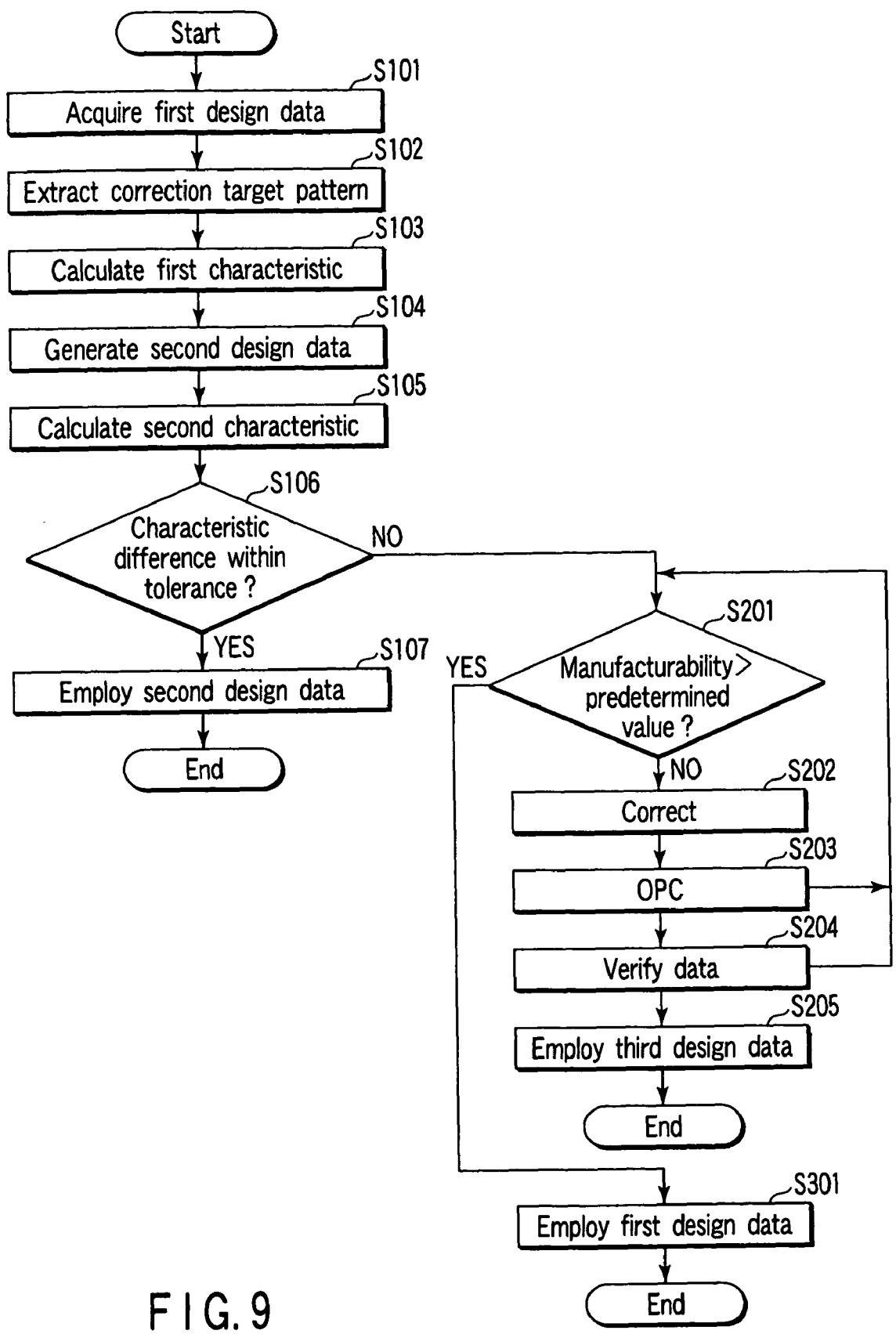
FIG. 9 is a flowchart showing a pattern creation method according to the second embodiment of the present invention.

The pattern data processing method of the third embodiment can also be applied to the method shown in FIG. 9. Referring to FIG. 9, after the above-described operations in steps S300 and S101 are executed, steps S102 to S301 are executed in the same way as in the processing in FIG. 9.

In the pattern data processing method of the third embodiment, whether patterns ensured by combining overlapping areas in placing cells are necessary for the device is stored in the database. Next, the cell place & router tool in the CPU places the cells included in the cell and corrects or removes unnecessary patterns by referring to the database. A pattern may be replaced with another layer, or Boolean operation (AND) of layers may be executed. After that, if the correction or removal of the unnecessary patterns does not influence the performance of the semiconductor integrated circuit to be manufactured, the semiconductor integrated circuit is manufactured in accordance with the cell pattern obtained by correcting or removing the unnecessary patterns.

In the third embodiment, the pattern data processing method is applied to an implanted layer. However, the phenomenon that a pattern near the minimum design rule is formed by pattern contact in overlapping areas without influence on device performance also occurs in the well process, metal process, gate process, and diffusion process. Hence, the pattern data processing method of the third embodiment can also be applied to the well process, metal process, gate process, and diffusion process.

Fourth Embodiment

In mask data processing (MDP), the manufacturability of the lithography process is increased by finely setting layout restrictions in accordance with the increase in accuracy of RET ad OPC. To finely set the layout restrictions, the design rule such as the restriction of pattern placement positions must be made complex in consideration of the minimum line width of a pattern, the adjacent space width between patterns, and an overlay error between layers.

In the lithography process, the minimum pattern size resoluble on a wafer can be decreased theoretically by shortening the irradiation light wavelength and increasing the NA of the projection optical system. Since a short wavelength is difficult to realize, the mainstream of resolution increase means is increasing the NA. Especially, the resolution of a 1:1 line & space (L/S) pattern can effectively be increased by increasing the NA. However, an increase in NA tends to decrease the lithography margin of an isolated pattern. Hence, when a fine pattern is to be formed by a projection optical system with a high NA, the minimum size of an isolated pattern is restricted. More specifically, a design rule in which a size (line width) W of an isolated pattern (W1<W2<W3) and an inter-pattern distance S to an adjacent pattern (S1<S2<S3) satisfy following relationships (1) to (3) needs to be created.

$$W1 \leq W < W2 : S1 \leq S \tag{1}$$

$$W2 \leq W < W3 : S2 \leq S \tag{2}$$

$$W3 \leq W : S3 \leq S \tag{3}$$

Figure 13A:
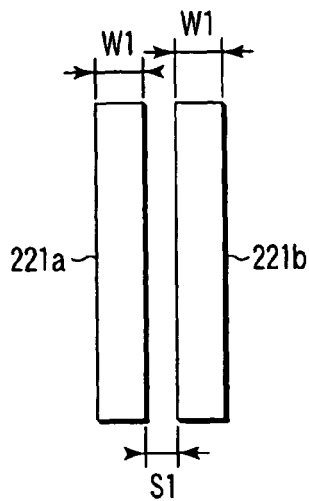
FIGS. 13A to 13D are schematic views showing patterns included in cells so as to explain a pattern data processing method according to a fourth embodiment of the present invention.
Figure 13B:
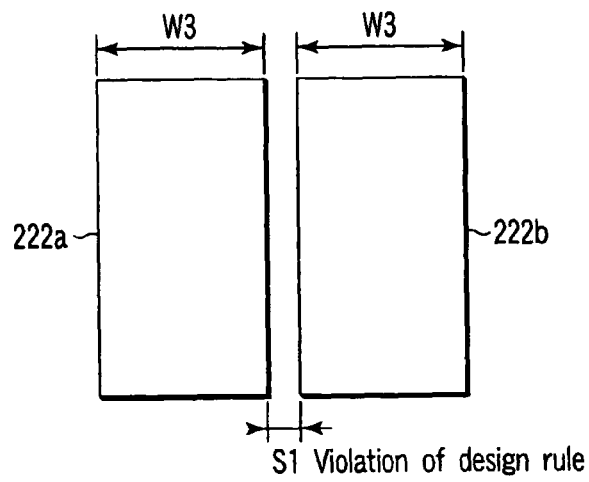
Figure 13C:
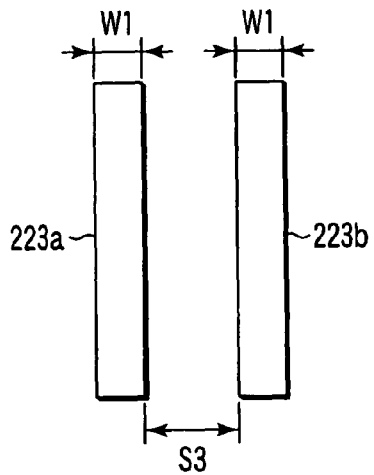
Figure 13D:
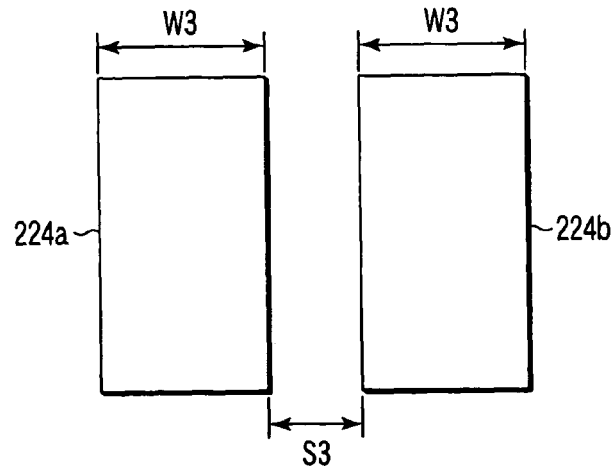
Figure 14:
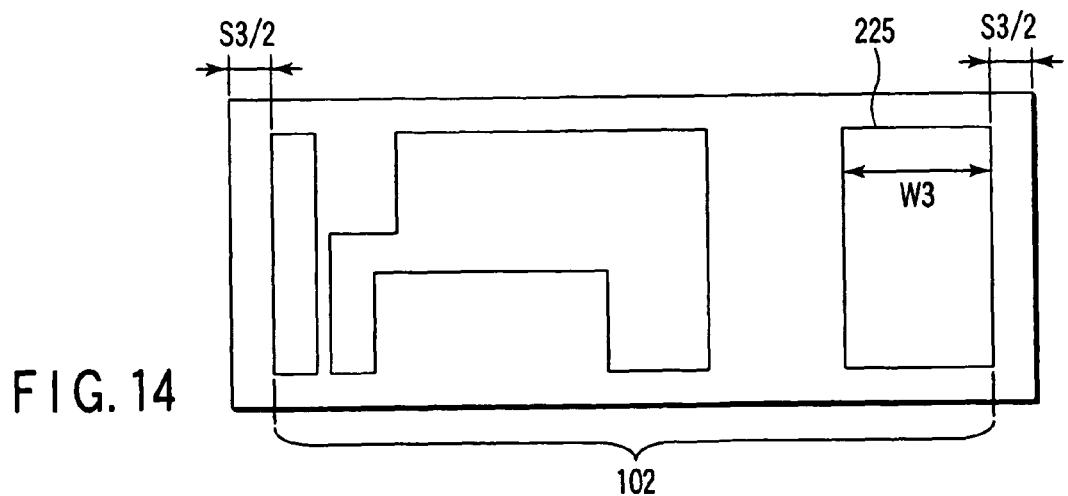
FIG. 14 is a schematic view showing cells so as to explain the pattern data processing method according to the fourth embodiment of the present invention.

In the example shown in FIG. 13A, patterns 221a and 221b each having the line width W1 are placed at the inter-pattern distance S1. The placement of the patterns 221a and 221b satisfies the design rule based on inequality (1). In the example shown in FIG. 13B, patterns 222a and 222b each having the line width W3 are placed at the inter-pattern distance S1. The placement of the patterns 222a and 222b violates the design rule based on inequality (3). In the example shown in FIG. 13C, patterns 223a and 223b each having the line width W1 are placed at the inter-pattern distance S3. The placement of the patterns 223a and 223b satisfies the design rule based on inequality (1). In the example shown in FIG. 13D, patterns 224a and 224b each having the line width W3 are placed at the inter-pattern distance S3. The placement of the patterns 224a and 224b satisfies the design rule based on inequality (3). As shown in FIGS. 13A to 13D, in the lithography process, providing a narrow space between wide patterns (lines) sometimes violates the design rule. Conventionally, to comply with the design rule defined by inequalities (1) to (3), "overlapping areas" having a width of ½ of S3 are uniformly ensured in cells each having a pattern 225 with the line width W3, as shown in FIG. 14.

Figure 15:
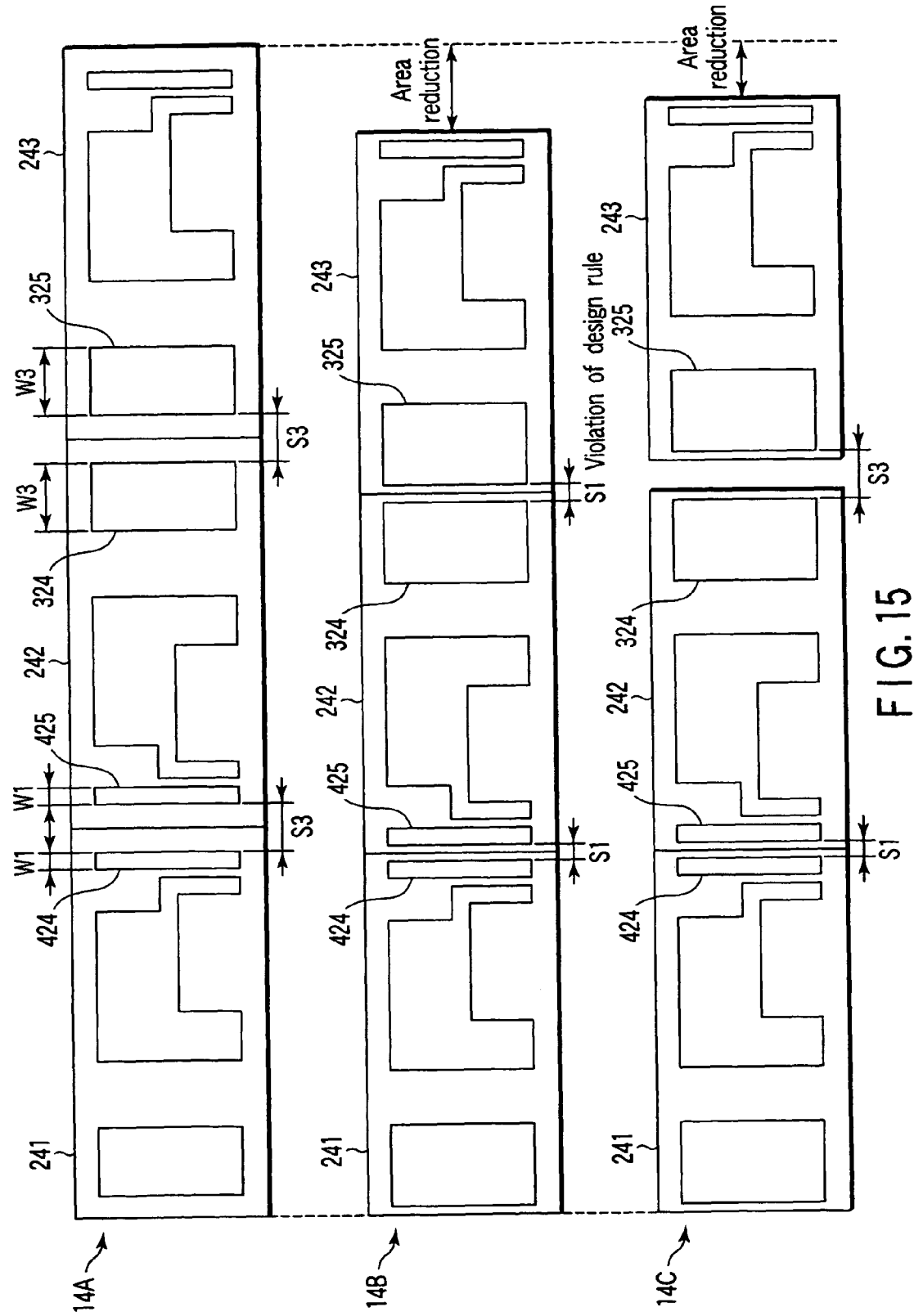
FIG. 15 is a schematic view showing a cell pattern so as to explain the pattern data processing method according to the fourth embodiment of the present invention.

In a placement example 14A shown in FIG. 15, the widths of the "overlapping areas" of cells 241, 242, and 243 are uniformly set to ½ of S3, and the cells 241, 242, and 243 are placed by the conventional data processing method. This placement complies with the design rule because the inter-pattern distance S3 is ensured between a pattern 324 with the line width W3 in the cell 242 and a pattern 325 with the line width W3 in the cell 243. However, the inter-pattern distance S3 ensured between a pattern 424 with the line width W1 in the cell 241 and a pattern 425 with the line width W1 in the cell 242 is redundant, resulting in an increase in chip area after cell placement.

In a placement example 14B, the widths of the "overlapping areas" of the cells 241, 242, and 243 are uniformly set to ½ of S1. In this case, the inter-pattern distance S the pattern 424 with the line width W1 in the cell 241 and the pattern 425 with the line width W1 in the cell 242 is S1. However, this placement violates the design rule because the inter-pattern distance S between the pattern 324 with the line width W3 in the cell 242 and the pattern 325 with the line width W3 in the cell 243 is also S1. In this case, in the data processing method according to the fourth embodiment, the inter-pattern distance S3 necessary between the patterns 324 and 325 is read out by referring to the database in which the design tool stores inequalities (1) to (3). Hence, the cells 242 and 243 are placed such that the inter-pattern distance S between the patterns 324 and 325 becomes S3, as in a placement example 14C shown in FIG. 15.

A dummy cell may be placed between the cells 242 and 243. Instead of changing the placement positions of the cells 242 and 243, only the widths of the "overlapping area" near the pattern 324 in the cell 242 and the "overlapping area" near the pattern 325 in the cell 243 may be changed to ½ of S3. If correction of the inter-pattern distance S has no influence on the performance of the semiconductor integrated circuit to be manufactured, the semiconductor integrated circuit is manufactured on the basis of layout data obtained by correcting the inter-pattern distance S.

According to the above-described pattern data processing method of the fourth embodiment, chip design can be done while minimizing the increase in chip area and satisfying the design rule. The data processing method of the fourth embodiment may be incorporated in the cell placement process of cell place & route design or executed after the cell placement process.

Fifth Embodiment

As described above, in a projection optical system with high NA, the lithography margin of an isolated pattern is small. In designing a chip by placing cells, terminating cells 141, 142, 143, and 144 placed at outermost positions face a wide space, as shown in FIG. 16. For this reason, the patterns of active regions such as diffusion regions near "overlapping areas" included in the terminating cells 141, 142, 143, and 144 placed at outermost positions must have a large width to ensure the lithography margin.

However, whether a cell stored in a cell library should be placed at an end of a chip or at the center of a chip is unknown until actual placement. Conventionally, for all cells included in a cell library, the patterns of active regions near the "overlapping areas" are uniformly made wide. However, when the patterns of active regions near the "overlapping areas" are uniformly wide, individual cell areas increase, resulting in an increase in the area of a chip designed by placing the cells.

To the contrary, according to a pattern data processing method of the fifth embodiment, after the design tool in the CPU places cells, only the widths of the active region of terminating cells are increased on the basis of the area of the space that the terminating cells face. At this time, the design rule may refer to a relational expression between the space area stored in a connected database and the minimum size of an active region corresponding to the space area.

The lithography margin of an active region included in a terminating cell may be ensured by placing a dummy cell on a side of the terminating cell facing the space, i.e., between the terminating cell and the space, instead of correcting the size of the active region included in the terminating cell.

As described above, according to the embodiments of the present invention, a pattern creation method, pattern data processing method, pattern data processing program, and semiconductor integrated circuit manufacturing method capable of decreasing the difficulty of the lithography process can be provided.

Other Embodiments

The present invention has been described above on the basis of the embodiments. The description and drawing as a part of the disclosure should not be understood to limit the present invention. Those skilled in the art can see, from the disclosure, various alternate embodiments, examples, and application techniques. For example, the above-described pattern creation method and data processing method can be expressed as a series of processes or operations consecutive in a chronological order. Hence, the pattern creation method and data processing method shown in FIG. 2 and the like can be implemented by a computer program product which specifies a plurality of functions executed by a processor in the CPU 300 shown in FIG. 1 to cause it to execute the pattern creation method and data processing method. The computer program product indicates a recording medium or recording device inputtable/outputtable to/from the CPU 300. The recording medium includes a memory device, magnetic disk device, optical disk device, and any other device capable of recording a program. That is, the present invention should the understood to incorporate various embodiments that are not described here. Hence, the present invention is limited only by the specifying items of appropriate claims on the basis of the disclosure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device pattern creation method comprising:
    extracting a correction target pattern having a size not more than a threshold value from first design data containing a pattern of a semiconductor device;
    calculating a first characteristic of the semiconductor device on the basis of the first design data;
    generating second design data by correcting the correction target pattern contained in the first design data;
    calculating a second characteristic of the semiconductor device on the basis of the second design data;
    checking whether a characteristic difference between the first characteristic and the second characteristic falls within a tolerance; and
    creating the semiconductor device pattern on the basis of the second design data when the characteristic difference falls within the tolerance.

2. The method according to claim 1, wherein correcting the correction target pattern includes erasing the correction target pattern from the first design data.

3. The method according to claim 1, wherein correcting the correction target pattern includes correcting the size of the correction target pattern, which is not more than the threshold value, to a size more than the threshold value.

4. The method according to claim 1, wherein when the characteristic difference falls outside the tolerance, the semiconductor device pattern is created on the basis of the first design data.

5. The method according to claim 1, wherein the threshold value includes a minimum size of an implantation target region in an ion implantation process.

6. The method according to claim 1, wherein letting T be the threshold value, $0.5 \geq T(\lambda/NA)$ is satisfied where $\lambda$ is a wavelength of light in exposure, and NA is a numerical aperture of a projection optical system of an exposure apparatus used in exposure.

7. The method according to claim 1, wherein each of the first characteristic and the second characteristic includes at least one of a transistor characteristic, a circuit characteristic, an electrical characteristic, a timing characteristic, a wiring capacitance characteristic, and a wiring resistance characteristic.

8. The method according to claim 1, further comprising:
    verifying manufacturability in an exposure process of the correction target pattern having the size not more than the threshold value when the characteristic difference falls outside the tolerance;
    creating the semiconductor device pattern on the basis of the first design data when the manufacturability is more than a predetermined value;
    generating third design data by correcting the correction target pattern contained in the first design data when the manufacturability is not more than the predetermined value;
    executing optical proximity correction for the third design data; and
    creating the semiconductor device pattern on the basis of the third design data when optical proximity correction is appropriately done for the third design data.

9. A semiconductor device manufacturing method of forming a pattern of a semiconductor device by using a photomask, comprising:
    formation of the photomask including
        extracting a correction target pattern having a size not more than a threshold value from first design data containing a pattern of the semiconductor device,
        calculating a first characteristic of the semiconductor device on the basis of the first design data,
        generating second design data by correcting the correction target pattern contained in the first design data,
        calculating a second characteristic of the semiconductor device on the basis of the second design data,
        checking whether a characteristic difference between the first characteristic and the second characteristic falls within a tolerance,
        creating a mask pattern of the semiconductor device on the basis of the second design data when the characteristic difference falls within the tolerance, and
        forming the photomask on the basis of the mask pattern of the semiconductor device.

10. A computer-readable storage device having instructions stored therein which, when executed on a computer, perform a method for designing a pattern of a semiconductor device, the method comprising the steps of:
    extracting, by the computer, a correction target pattern having a size not more than a threshold value from first design data containing the pattern of the semiconductor device;
    calculating, by the computer, a first characteristic of the semiconductor device on the basis of the first design data;
    generating, by the computer, second design data by correcting the correction target pattern contained in the first design data;
    calculating, by the computer, a second characteristic of the semiconductor device on the basis of the second design data;
    checking, by the computer, whether a characteristic difference between the first characteristic and the second characteristic falls within a tolerance; and
    creating, by the computer, the pattern of the semiconductor device on the basis of the second design data when the characteristic difference falls within the tolerance.

11. The storage device according to claim 10, wherein correcting the correction target pattern includes erasing the correction target pattern from the first design data.

* * * * *